United States Patent [19]

Davis

[11] Patent Number: 5,495,076

[45] Date of Patent: Feb. 27, 1996

[54] FLEXIBLE GEOMETRY CIRCUIT BOARD

[75] Inventor: Michael S. Davis, Bloomfield Hills, Mich.

[73] Assignee: Ford Motor Company, Dearborn, Mich.

[21] Appl. No.: 136,843

[22] Filed: Oct. 18, 1993

[51] Int. Cl.[6] .................................................. H05K 1/00
[52] U.S. Cl. .................... 174/254; 180/90; 361/749; 439/67; 174/250
[58] Field of Search .................................. 174/250, 254; 361/749; 439/67, 77; 180/90

[56] References Cited

U.S. PATENT DOCUMENTS

| | | | |
|---|---|---|---|
| 3,979,763 | 9/1976 | Mills | 354/187 |
| 4,191,441 | 3/1980 | Ryder et al. | 339/17 F |
| 4,359,277 | 11/1982 | Shimizu et al. | 354/219 |
| 4,587,719 | 5/1986 | Barth | 29/577 |
| 4,974,121 | 11/1990 | Masuko et al. | 361/428 |
| 4,986,870 | 1/1991 | Frohlich | 156/382 |
| 5,008,496 | 4/1991 | Schmidt et al. | 174/254 |
| 5,032,737 | 7/1991 | Holm et al. | 307/9.1 |
| 5,121,297 | 6/1992 | Haas | 361/398 |
| 5,142,448 | 8/1992 | Kober et al. | 361/398 |
| 5,144,742 | 9/1992 | Lucas et al. | 29/830 |
| 5,250,758 | 10/1993 | Fjelstad et al. | 174/254 |
| 5,357,065 | 10/1994 | Mitamura et al. | 200/5 A |

FOREIGN PATENT DOCUMENTS

| | | |
|---|---|---|
| 1766162 | 10/1969 | Germany. |
| 4-246882 | 9/1992 | Japan. |
| 1287074 | 8/1972 | United Kingdom. |

OTHER PUBLICATIONS

Abrasion Resistance (plus 8 more KEL-F® 81 virtues) helps fold miniaturization problems down to size? Minnesota Mining & Manufacturing Co., Electronic Design, Aug. 2, 1962, p. 132.

*Primary Examiner*—Laura Thomas
*Attorney, Agent, or Firm*—Mark S. Sparschu; Roger L. May

[57] ABSTRACT

A circuit board has one or more planar sections each connected to another portion of the circuit board by springs. The springs allow the sections of the circuit board connected by the springs to move in the planes of the sections relative to the remainder of the circuit board. An electrical device such as an automotive instrument cluster uses the circuit board in conjunction with gauges and a face plate. A method of producing an automotive instrument cluster includes the steps of attaching the gauges to the circuit board and mounting the gauges to a face plate.

17 Claims, 4 Drawing Sheets

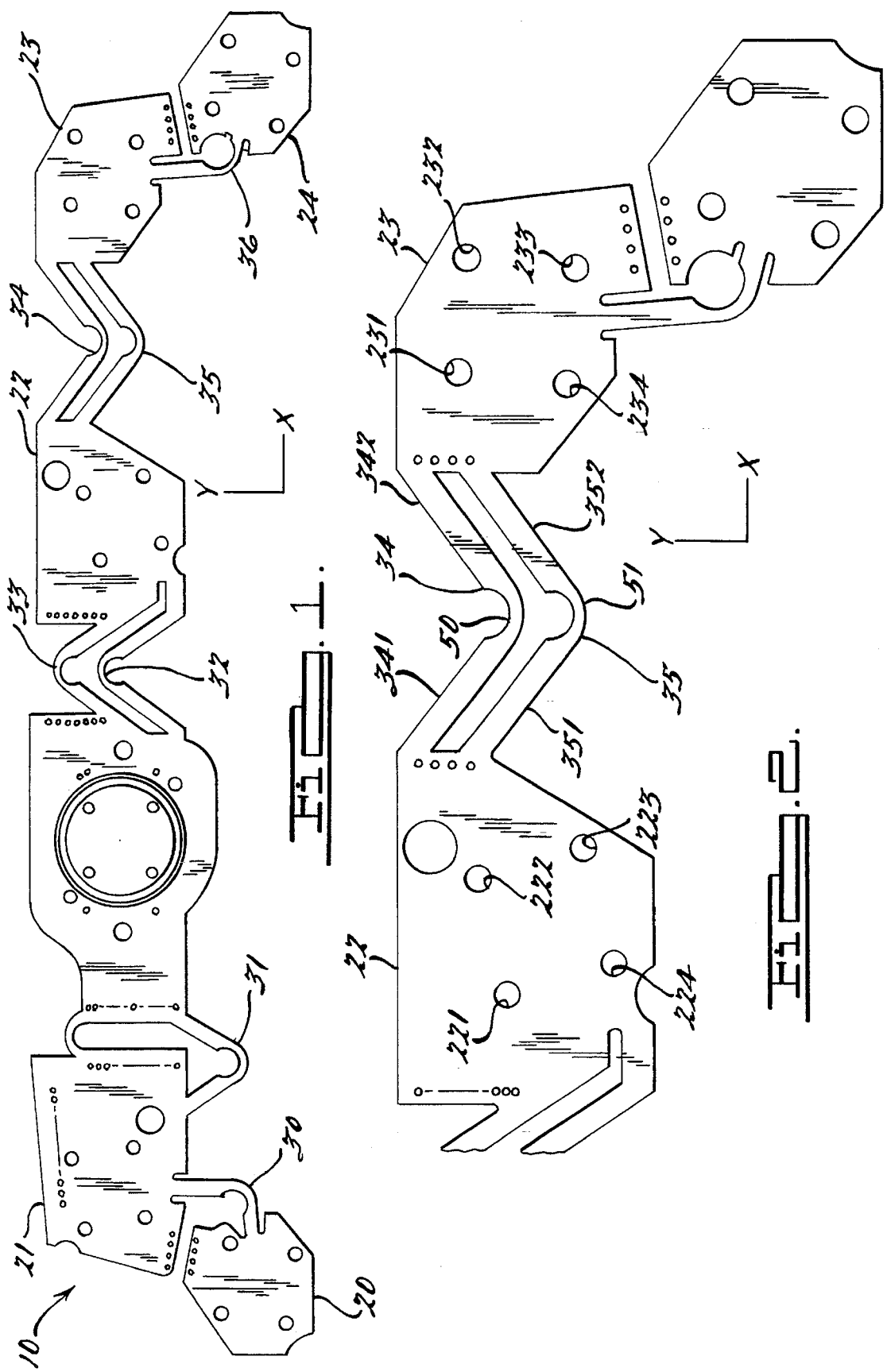

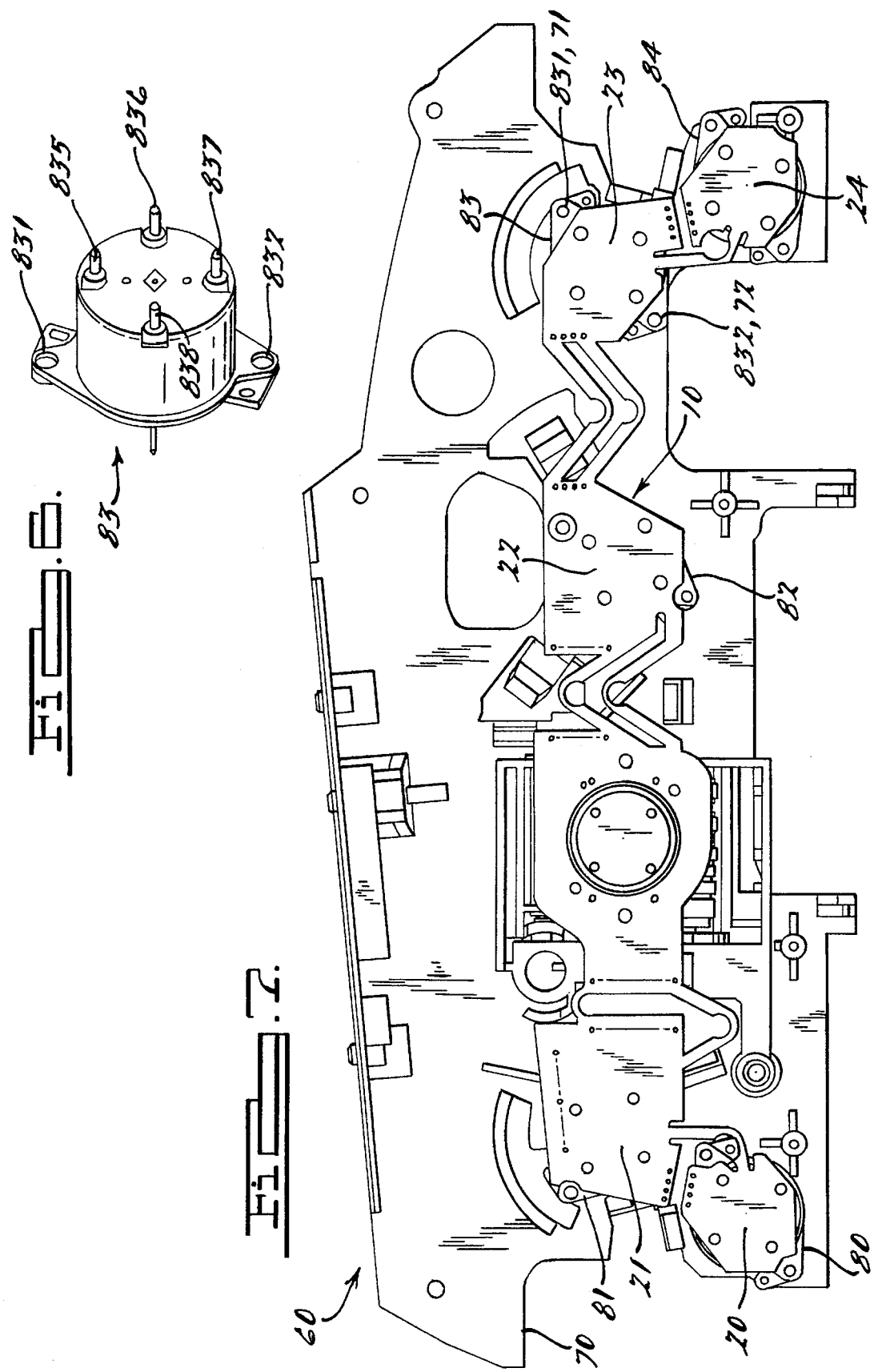

FLEXIBLE GEOMETRY CIRCUIT BOARD

BACKGROUND OF THE INVENTION

1. Field of the Invention

The present invention relates to a circuit board. Further, the invention relates to an electrical device which contains the circuit board. Finally, the invention relates to a method of producing the electrical device.

2. Description of the Related Art

It is well-known in the art to use circuit boards in automotive instrument clusters. Such instrument clusters frequently contain several gauges to display particular quantities related to the operation of the automobile (for example, oil pressure, battery voltage, and engine RPM). Each gauge typically has a shaft which protrudes through a face plate of the instrument cluster. A pointer is mounted on the shaft. The pointer indicates, with reference to graduations on the front of the face plate and visible to the driver of the automobile, the value of the particular quantity being reported by the gauge. Each gauge further has several terminals, typically cylindrical, for electrical connections to the gauge. The terminals are typically attached to a circuit board, often an inflexible or "hard" circuit board.

A problem is encountered in the assembly of instrument clusters. The gauges are typically attached to a hard circuit board early in the assembly of an instrument cluster. Typically, the terminals of the gauges are inserted through holes in the circuit board. The terminals are then soldered to the circuit board to effect attachment and electrical connection of the gauges to the circuit board. Once the attachments to the circuit board are made, the gauges are mounted to the face plate of the instrument cluster. This mounting is typically done with screws which are inserted through holes in flanges in the gauges and which are then driven into holes in the back of the face plate. The problem encountered is in making all of the holes in the flanges of all of the gauges line up with all of the corresponding holes in the face plate. This problem is encountered due to the relative positions of all of the gauges having been fixed by the prior soldering of the gauge terminals to the circuit board.

One solution to this problem is to employ multiple circuit boards, each with holes to accommodate the terminals of some of the gauges. The relative positions of all of the gauges are therefore not fixed when the gauges are soldered to the circuit boards. This solution has several problems, including the proliferation of parts needed to build an instrument cluster and the need to provide electrical connections between the multiple circuit boards.

A second well-known solution to the problem is to mount conductive metal clips to the circuit board. One clip is provided for each terminal of each gauge. Each clip has a hole with deflectable tangs protruding into the hole. The clips allow some tolerance for misalignment of the terminals of the gauges and the holes in the clips. Each terminal of each gauge is seated in the hole in a clip and retained by tension of the deflected tangs. The use of these clips, while helping to solve the gauge alignment problem, has a number of disadvantages. For example, the clips are much more expensive than simple holes in the circuit board and the use of the clips proliferates the number of parts needed in assembly of the circuit board.

The prior art also recognizes the use of flexible material for use as the circuit board. Such material is typically a very thin plastic. A circuit board made of such flexible material does provide flexibility to help overcome the problem of misalignment of the gauges and their mounting holes. However, there are disadvantages to the use of such flexible material, including higher cost than traditional hard circuit board material and reduced reliability.

U.S. Pat. No. 5,008,496 discloses a circuit board made of thermoplastic with flexible sections and non-flexible sections. The flexible sections are thinner than the non-flexible sections. Electronic components are mounted on the non-flexible sections of the circuit board. This circuit board, while providing flexibility to a rigid circuit board, is more suited to circuit boards intended to be bent into three-dimensional shapes. Considerable flexibility is provided to allow the circuit board to be bent into a box shape, while flexibility in the two dimensions in the plane of each non-flexible section is not assured.

Given the lack of attractive solutions to the problem of assembling an instrument cluster, a hard circuit board whose gauge-mounting sections can be moved to allow the mounting of the gauges to the face plate of the instrument cluster would provide significant advantages over the prior art.

SUMMARY OF THE INVENTION

The present invention provides a circuit board with sections which can be moved relative to one another.

The circuit board of this invention comprises at least one planar section with means for attaching electrical components such as gauges. The circuit board further comprises spring means which connect each planar section to another portion of the board so that each planar section can be moved in two axes which define the plane of the section.

The circuit board of the present invention solves the problem described above in the production of instrument clusters. The sections of the circuit board can be moved to facilitate mounting of the gauges to holes in the face plate of the instrument cluster. Clips, which add cost and unreliability to the instrument cluster, can therefore be eliminated. Furthermore, flexible circuit board material is not required to provide the flexibility possessed by the circuit board of the present invention. Hard circuit board, which provides cost and reliability advantages over flexible circuit board, can be used.

The present invention further provides an electrical device, such as an instrument cluster, which uses the circuit board of the present invention. In addition to the circuit board, the electrical device comprises a plurality of gauges attached to the circuit board. Further, the electrical device comprises a face portion, such as a face plate of an automotive instrument cluster. The gauges are mounted to this face portion, in addition to being attached to the circuit board.

Finally, the present invention provides a method of producing an electrical device such as an automotive instrument cluster. The method comprises the step of attaching gauges to a circuit board which has movable sections. The method further comprises the step of mounting the gauges to a face plate of the instrument cluster, moving the movable sections of the circuit board so as to facilitate mounting the gauges to the face plate.

BRIEF DESCRIPTION OF THE DRAWINGS

FIG. 1 is one embodiment of a circuit board according to the present invention.

FIG. 2 is an enlarged view of part of FIG. 1, showing in detail two sections of the circuit board and the springs connecting the sections.

FIG. 6 is a rear perspective view of a gauge commonly used in automotive instrument clusters.

FIG. 7 is a rear elevation view of the partially assembled automotive instrument cluster of FIG. 5.

DETAILED DESCRIPTION OF THE INVENTION

Figure 3:
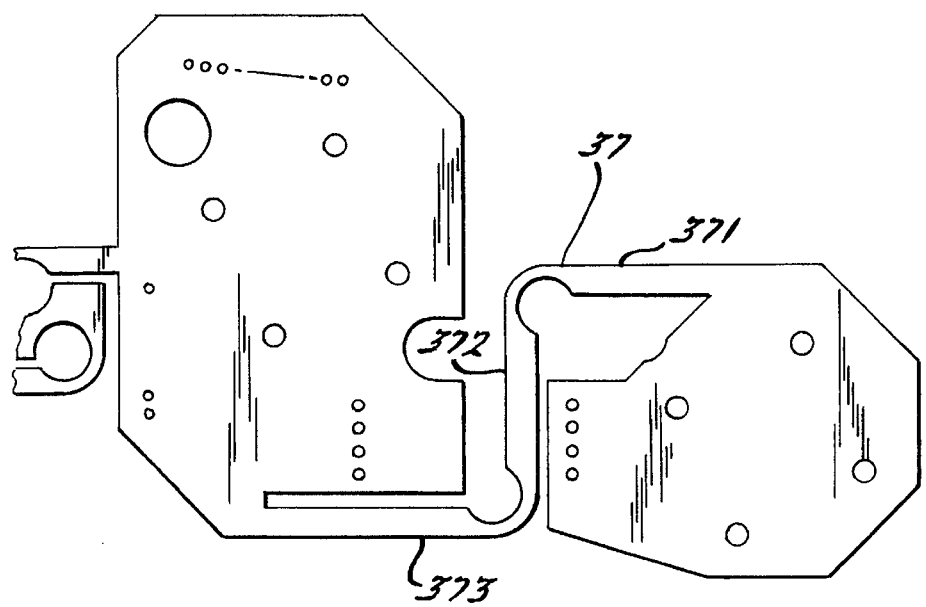
FIG. 3 depicts a view similar to FIG. 2, but showing a different configuration of the springs.

FIG. 1 shows a circuit board 10 according to this invention. The circuit board has planar sections 20, 21, 22, 23, and 24, each section connected to another portion of the circuit board by springs 30, 31, 32, 33, 34, 35, and 36. FIG. 2 shows an enlargement of a part of FIG. 1, showing sections 22 and 23 and springs 34 and 35 in greater detail.

Sections 20, 21, 22, 23, and 24 of circuit board 10 include holes for attaching gauges to the sections. For example, section 22 has four holes 221, 222, 223, and 224 through which terminals of a gauge can pass for attachment of the gauge to the circuit board. Section 23 similarly contains holes 231, 232, 233 and 234.

In the embodiment of the invention shown in FIG. 1, springs 30, 31, 32, 33, 34, 35, and 36 are composed of two or more beams. Referring to FIG. 2, spring 34 is composed of beams 341 and 342 and spring 35 is composed of beams 351 and 352. The beams are joined at an angle such that the beams are not collinear. The springs thus formed can flex. This allows the sections connected by the springs to be moved in relation to one another and in relation to the rest of the circuit board in the two orthogonal axes designated "x" and "y" in FIGS. 1 and 2.

Considerable advantage is gained if circuit board 10 is made of fiberglass circuit board material, one of the materials commonly known in the art as "hard" circuit board material. (Circuit board material composed of paper, epoxy, fiberglass, or composites of those materials is commonly called "hard" circuit board material). The springs provided by the invention allow flexibility of circuit board 10 while maintaining the advantages of hard circuit board material. Those advantages include low cost and high durability.

When fiberglass circuit board material is used, a very advantageous way of fabricating circuit board 10 of FIG. 1 is by stamping. If this method of fabricating circuit board 10 is chosen, the width of the beams should be at least twice the thickness of the circuit board. This allows circuit board 10 to survive the stamping process without breaking. Note, however, that this requirement applies if circuit board 10 is fabricated by stamping. If other methods of fabricating circuit board 10 are employed, this requirement does not necessarily apply.

A particular type of fiberglass circuit board material widely used in automotive applications is known as FR-4. This type of material comes in standard thickness of approximately 1.5 millimeters. Therefore, if circuit board 10 depicted in FIG. 1 were fabricated by stamping from FR-4 circuit board material, the beams would be approximately 1.5 millimeters thick and at least 3 millimeters wide. For maximum flexibility, this lower limit of approximately 3 millimeters would ideally be used.

Further flexibility of springs 30, 31, 32, 33, 34, 35, and 36 is gained because notches are removed from the beams which compose the springs. FIG. 2 illustrates two such notches 50 and 51. Note that in FIG. 1, all of the notches in circuit board 10 are located at the point of intersection of two beams (as are notches 50 and 51 in FIG. 2). However, removing the notches from anywhere in a beam provides added flexibility.

Notice also in FIG. 1 that some sections are joined by multiple springs (for example, section 22 and section 23 are joined by springs 34 and 35). On the other hand, some sections are joined by a single spring (for example, section 20 and section 21 are joined by spring 30). The use of multiple springs provides added strength (that is, greater resistance to breakage of the springs as they flex). The use of multiple springs, however, provides relatively less flexibility than the use of a single spring.

Figure 4:
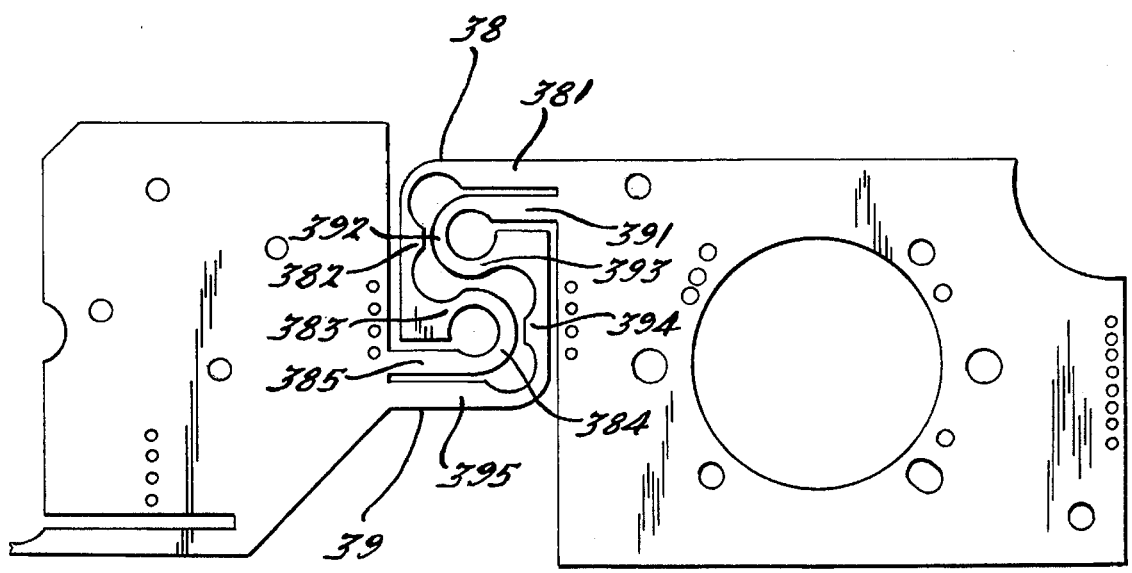
FIG. 4 also depicts a view similar to FIG. 2, but showing another different configuration of the springs.

FIGS. 3 and 4 show alternate construction of the springs of the present invention. Note that in FIGS. 1 and 2, all of the springs 30, 31, 32, 33, 34, 35, and 36 are composed of two beams. Spring 37 in FIG. 3 is composed of three beams, 371, 372, and 373. Springs 38 and 39 in FIG. 4 are both composed of five beams. Spring 38 is composed of beams 381, 382, 383, 384, and 385. Spring 39 is composed of beams 391, 392, 393, 394, and 395. In general, springs composed of a greater number of beams (for example, three or five) tend to provide greater flexibility than springs composed of a smaller number of beams (for example, two).

Figure 5:
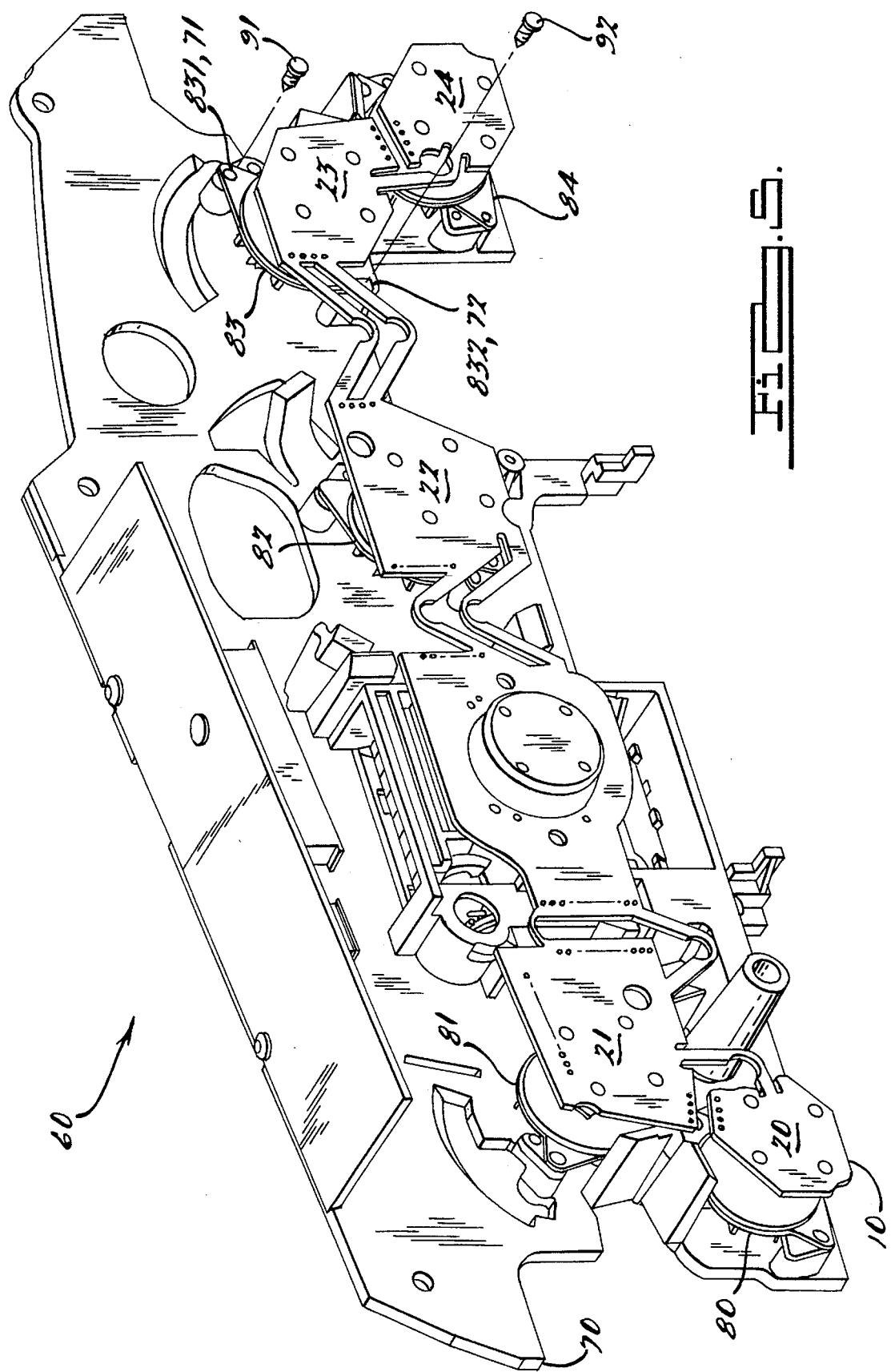
FIG. 5 is a rear perspective view of a partially assembled automotive instrument cluster containing the circuit board of the present invention.

FIG. 5 shows another embodiment of the present invention, an automotive instrument cluster 60, in a partially assembled configuration. Instrument cluster 60 contains circuit board 10 of FIG. 1. Furthermore, instrument cluster 60 contains a face portion 70, which is commonly called a face plate in the art. Instrument cluster 60 further includes gauges 80, 81, 82, 83, and 84. Gauge 83, representative of gauges 80, 81, 82, 83, and 84, is shown in FIG. 6. Gauge 83 has terminals 835, 836, 837 and 838. Gauge 83 further has holes 831 and 832 by which gauge 83 can be mounted with screws to face portion 70 of instrument cluster 60.

Referring to FIGS. 5 and 7, gauge 83 is attached to circuit board 10 by terminals 835, 836, 837, and 838 of gauge 83 going through holes 231, 232, 233, and 234 in section 23 of circuit board 10. Terminals 835, 836, 837, and 838 are then soldered to circuit board 10. Gauges 80, 81, 82, and 84 are attached to circuit board 10 in a similar manner. Gauge 83 is then mounted to face portion 70 of instrument cluster 60, by screws 91 and 92 through holes 831 and 832 in gauge 83 and into corresponding holes 71 and 72 in face portion 70. Gauges 80, 81, 82, and 84 are mounted to face portion 70 in a similar manner.

A final embodiment of the present invention is a process for assembling an automotive instrument cluster. This process is illustrated with reference to FIG. 5. In this process, gauges 80, 81, 82, 83, and 84 are attached to circuit board 10. Gauges 80, 81, 82, 83, and 84 are then mounted to face plate 70 of instrument cluster 60. However, attaching gauges 80, 81, 82, 83, and 84 to circuit board 10 fixes the relative positions of the gauges. Tolerance stack-ups make it highly unlikely that all of holes in all of the gauges (for instance, holes 831 and 832 in gauge 83) will then line up properly with all of the holes in face plate 70 (for instance, holes 71 and 72). Therefore, the process of this embodiment of the invention further comprises the step of moving sections 20, 21, 22, 23, and 24 as required so the holes in gauges 80, 81, 82, 83 and 84 line up with the holes in face plate 70. Gauges 80, 81, 82, 83 and 84 are then mounted to face plate 70.

Various modifications and variations will no doubt occur to those skilled in the arts to which this invention pertains. Such variations which generally rely on the teachings through which this disclosure has advanced the art are properly considered within the scope of this invention. For example, it was mentioned that "hard" circuit board is an ideal choice as a material for circuit board 10 of FIG. 1. However, the invention can also be employed to advantage if other circuit board materials are used. The same advantage is gained whenever a circuit board of sufficient thickness as to be substantially not moveable in the x-y plane illustrated in FIG. 1 is employed. "Sufficient" thickness is a function of the particular material used to make the circuit board.

What is claimed:

1. A circuit board comprising:
    at least one planar section containing attachment means for attaching electrical components;
    a portion of said circuit board distinct from said at least one planar section; and
    spring means for connecting said at least one section to said portion of said circuit board so that each section so connected can be moved relative to said portion in two orthogonal axes in the plane of said section;
    wherein said at least one section, said portion and said spring means are fabricated from a single piece of material.

2. A circuit board as recited in claim 1 wherein said circuit board has substantially constant thickness.

3. A circuit board as recited in claim 2 wherein said material is of sufficient thickness and rigidity such that said at least one section would be substantially immovable relative to said portion in said two orthogonal axes without said spring means.

4. A circuit board as recited in claim 3 wherein said material is hard circuit board material.

5. A circuit board as recited in claim 4 wherein said spring means comprise at least two beams, said beams being joined at an angle so that said beams are non-collinear.

6. A circuit board as recited in claim 5 wherein said attachment means includes holes in said circuit board disposed so as to accommodate attachment of gauges.

7. A circuit board as recited in claim 6 wherein a notch is removed from at least one portion of said at least one spring means.

8. A circuit board as recited in claim 7 wherein said notch is arc-shaped.

9. A circuit board as recited in claim 8 wherein said at least two beams have a width and a thickness, said thickness being approximately 1.5 millimeters and said width being at least approximately 3 millimeters, and wherein said circuit board material is FR-4 circuit board material.

10. A circuit board as recited in claim 8 wherein said width is approximately 3 millimeters.

11. A circuit board as recited in claim 1, wherein said material is hard circuit board material.

12. A circuit board as recited in claim 1, wherein said material is fiberglass.

13. A circuit board as recited in claim 1, wherein said material is FR-4 circuit board material.

14. An electrical device comprising:
    a circuit board including at least one planar section containing attachment means for attaching electrical components, a portion of said circuit board distinct from said at least one planar section, and spring means connecting said at least one section to said portion of said circuit board so that said at least one section so connected can be moved relative to said portion in two orthogonal axes in the plane of said section, wherein said at least one section, said portion and said spring means are fabricated from a single piece of hard circuit board material;
    at least one gauge attached to said circuit board by said attachment means; and
    a face portion of said electrical device to which said at least one gauge is mounted.

15. An electrical device as recited in claim 14 wherein said face portion of said electrical device is a face plate of an automotive instrument cluster.

16. A method of producing an electrical device, said method comprising the steps of:
    providing a face portion;
    providing at least one gauge;
    providing the circuit board recited in claim 2;
    attaching said attachment means to said at least one gauge; and
    mounting said at least one gauge to said face portion, moving said at least one section so as to facilitate said attachment of said at least one gauge to said face portion.

17. A method of producing an electrical device as recited in claim 16 wherein said face portion is a face plate of an automotive instrument cluster.

* * * * *